[12] United States Patent
Choi et al.

(10) Patent No.: US 8,212,428 B2
(45) Date of Patent: Jul. 3, 2012

(54) PORTABLE POWER SUPPLY APPARATUS FOR GENERATING MICROWAVE-EXCITED MICROPLASMAS

(75) Inventors: Jun Choi, Pohang-si (KR); Jae Koo Lee, Pohang-si (KR); Jae Yoon Sim, Pohang-si (KR)

(73) Assignee: Postech Academy Industry Foundation, Pohang-si, Gyeongsangbuk-do (KR)

( * ) Notice: Subject to any disclaimer, the term of this patent is extended or adjusted under 35 U.S.C. 154(b) by 400 days.

(21) Appl. No.: 12/472,425

(22) Filed: May 27, 2009

(65) Prior Publication Data
US 2010/0207528 A1 Aug. 19, 2010

(30) Foreign Application Priority Data
Feb. 18, 2009 (KR) .................. 10-2009-0013574

(51) Int. Cl.
*H02J 7/00* (2006.01)
(52) U.S. Cl. ........................... 307/150; 307/106
(58) Field of Classification Search .................. 307/106, 307/150
See application file for complete search history.

(56) References Cited

U.S. PATENT DOCUMENTS

| | | | | |
|---|---|---|---|---|
| 5,521,360 | A * | 5/1996 | Johnson et al. | 219/709 |
| 6,899,817 | B1 * | 5/2005 | Becker et al. | 216/70 |
| 6,922,021 | B2 * | 7/2005 | Espiau et al. | 315/248 |
| 7,294,563 | B2 * | 11/2007 | Al-Bayati et al. | 438/513 |
| 7,303,982 | B2 * | 12/2007 | Collins et al. | 438/514 |
| 7,612,598 | B2 * | 11/2009 | Endo | 327/291 |
| 7,642,180 | B2 * | 1/2010 | Al-Bayati et al. | 438/513 |
| 7,700,465 | B2 * | 4/2010 | Collins et al. | 438/513 |
| 2009/0159214 | A1 * | 6/2009 | Kasai | 156/345.41 |

* cited by examiner

*Primary Examiner* — Adi Amrany
(74) *Attorney, Agent, or Firm* — Kile Park Goekjian Reed & McManus PLLC

(57) ABSTRACT

Provided is a portable power supply apparatus for generating microwave plasma, capable of minimizing a power reflected from a plasma generation apparatus and improving power consumption of the plasma generation apparatus by generating the plasma by using a microwave having a specific frequency, monitoring the power reflected from the plasma generation apparatus after the generation of the plasma, detecting a changed impedance matching condition, and correcting the frequency.

10 Claims, 5 Drawing Sheets

PORTABLE POWER SUPPLY APPARATUS FOR GENERATING MICROWAVE-EXCITED MICROPLASMAS

BACKGROUND OF THE INVENTION

1. Field of the Invention

The present invention relates to a portable power supply apparatus, and more particularly, to a portable power supply apparatus for generating microwave plasma, capable of minimizing a power reflected from a plasma generation apparatus and improving power consumption of the plasma generation apparatus by generating the plasma by using a microwave having a specific frequency, monitoring the power reflected from the plasma generation apparatus after the generation of the plasma, detecting a changed impedance matching condition, and correcting the frequency.

2. Description of the Related Art

Recently, plasma treatments have been developed for various applications in the biomedical field such as blood coagulation, sterilization, pasteurization, teeth whitening, and cancer care. In order to use the plasma for the applications in the biomedical field, it is necessary to develop a plasma generation apparatus which can operate to generate the plasma at the atmospheric pressure rather than a plasma generation apparatus used in semiconductor processes where the plasma is generated at a low pressure in a vacuum chamber.

In general, a power required for generating the plasma at the atmospheric pressure is higher than that required at the low pressure in the vacuum chamber.

FIG. 1 is a graph illustrating a relationship between a pressure and an ignition power at the time of generating plasma.

Referring to FIG. 1, it can be seen that an ignition power of about 0.25 W is required to generate the plasma in a low pressure condition, for example, a pressure of about 1 Torr which can be implemented in a vacuum chamber. On the contrary, it can be seen that an ignition power of about 2.5 W is required to generate the plasma in a high pressure condition, for example, the atmospheric pressure of about 760 Torr.

The graph of FIG. 1 illustrates a result of measurement of the power required for generation of the plasma in the plasma generation apparatus according to the pressure condition including the atmospheric. Particularly, the measurement is performed without any gas flow into the plasma generation apparatus. In a case where a gas is flown into the plasma generation apparatus in order to generate a plasma jet, the power for generation of the plasma is further increased.

Therefore, in the conventional atmospheric plasma generation apparatus, a high power is needed to generate the plasma at the atmospheric pressure condition. Accordingly, there is a problem in that a volume and size of the power supply apparatus is too large to carry.

FIG. 2 is a graph illustrating reflection coefficients before and after generation of plasma in a microwave plasma generation apparatus. Hereinafter, the microwave plasma generation apparatus denotes an apparatus for generating plasma by using a microwave as a power source.

In FIG. 2, the graph (a) illustrates a power reflected from the microwave plasma generation apparatus before generation of the plasma, that is, before ignition unloaded, and the graph (b) illustrates a power reflected from the microwave plasma generation apparatus after generation of the plasma, that is, after ignition, where the plasma is generated by using argon (Ar) or helium (He) gas at the atmospheric pressure of 760 Torr with a power of 1 W. Referring to the graph (a) before the generation of the plasma, it can be understood that the microwave plasma generation apparatus is designed to be optimized at a frequency of 875 MHz corresponding to the lowest reflection coefficient.

However, it can also be understood from the graph (b) illustrating the reflection coefficient after the generation of the plasma that the reflection coefficient is changed after the generation of the plasma at the atmospheric pressure by using the microwave plasma generation apparatus which is optimized at the frequency of 875 MHz.

In general, as shown in the graph (b), due to the change in capacitance at the atmospheric pressure, the operating frequency becomes slightly lower than the initial frequency of 875 MHz.

Charged particles such as ions and electrons existing in the generated plasma influence an electric field, so that the capacitance of the plasma generation apparatus becomes different from the initially-designed value. For this reason, the initially-designed impedance matching is changed after the generation of the plasma in the microwave plasma generation apparatus.

Therefore, if the initially-designed frequency of the microwave is supplied to the microwave plasma generation apparatus without any correction, the increase in the reflection power caused from the decrease in the operating frequency cannot be controlled. Accordingly, there is a problem in that an efficiency of power is lowered due to unnecessary power consumption.

SUMMARY OF THE INVENTION

The present invention provides a portable power supply apparatus capable of minimizing a power reflected from a plasma generation apparatus by generating the plasma by using a microwave at the atmospheric pressure with a low power, monitoring a power reflected from the plasma generation apparatus after the generation of the plasma, and correcting the frequency based on a change in the reflection power. The present invention also provides a portable power supply apparatus capable of greatly reducing a volume and weight of the portable power supply apparatus and improving a portability thereof by mounting the portable power supply apparatus on a printed circuit board or in a one chip.

According to an aspect of the present invention, there is provided a portable power supply apparatus for supplying a power to a microwave plasma generation apparatus for generating microwave plasma, comprising: an oscillation amplification unit which has an output stage connected to microwave plasma generation apparatus and which has an oscillator for supplying an amplified microwave; and a reflection power feedback unit which has the one stage connected to the microwave plasma generation apparatus to receive as a feedback a reflection power reflected from the microwave plasma generation apparatus 100 at the time of generation of the plasma and measure a gradient of the reflection power and which has the other stage connected to the oscillation amplification unit to generate a switching control signal for adjusting the frequency of the microwave as a frequency suitable for the changed reflection power and supply the switching control signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
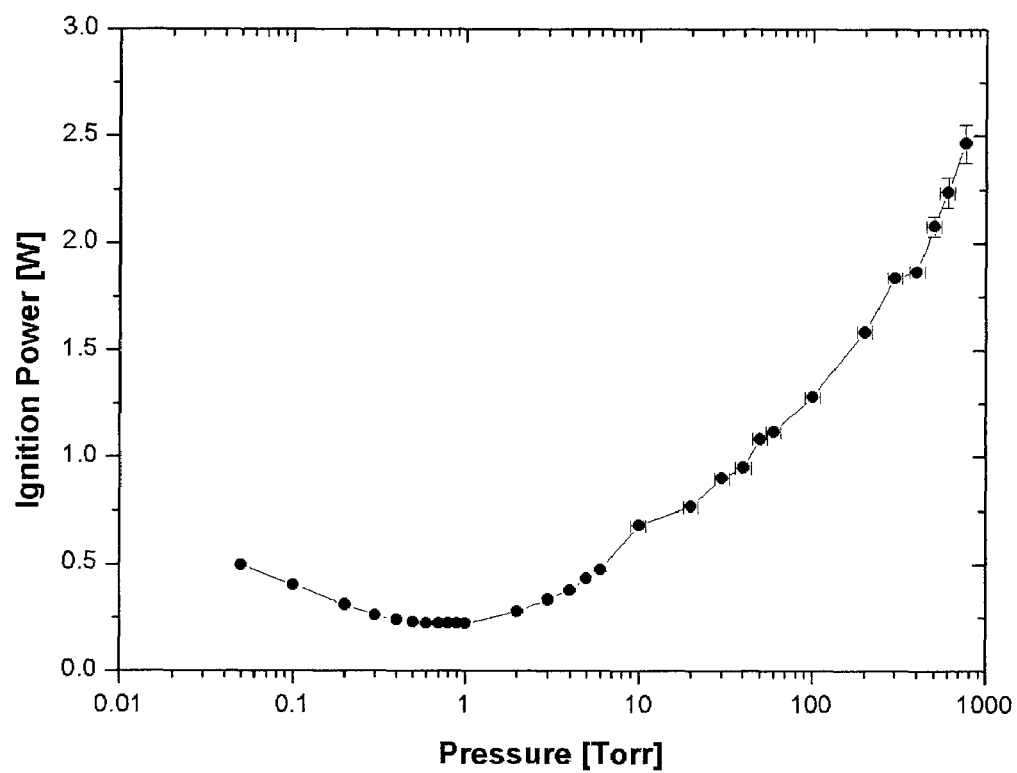
FIG. 1 is a graph illustrating a relationship between a pressure and an ignition power at the time of generating plasma.
Figure 2:
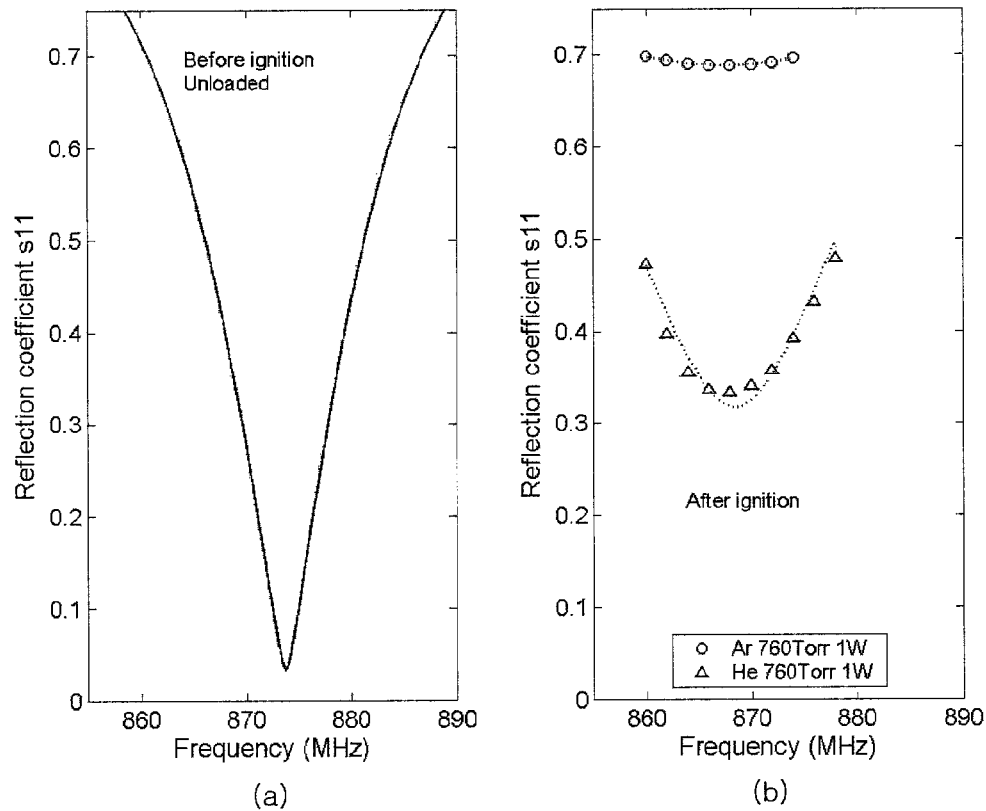
FIG. 2 is a graph illustrating reflection coefficients before and after generation of plasma in a microwave plasma generation apparatus.
Figure 3:
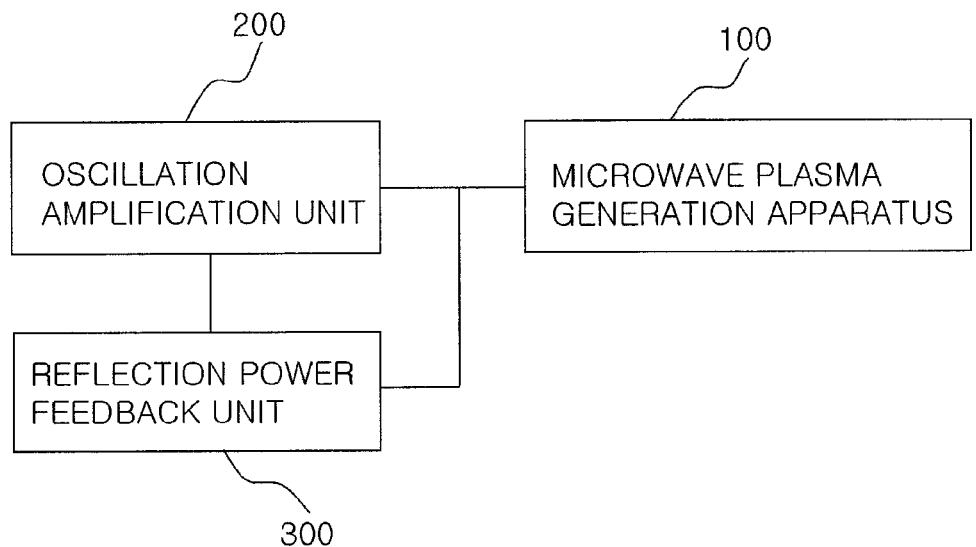
FIG. 3 is a schematic block diagram illustrating a construction of a portable power supply apparatus for generating microwave plasma according to the present invention.

FIG. 3 is a schematic block diagram illustrating a construction of a portable power supply apparatus for generating microwave plasma according to the present invention.

Referring to FIG. 3, the portable power supply apparatus for generating microwave plasma includes: an oscillation amplification unit 200 which has an oscillator for supplying an amplified microwave having an energy for generation of the microwave plasma and which has an output stage connected to a microwave plasma generation apparatus 100; and a reflection power feedback unit 300 which has the one stage connected to the microwave plasma generation apparatus 100 to receive as a feedback a reflection power reflected from the microwave plasma generation apparatus 100 and which has the other stage connected to the oscillation amplification unit 200 to generate a switching control signal for adjusting the oscillation frequency of the microwave as a frequency suitable for a reflection coefficient which is changed at the time of generation of the plasma and supply the switching control signal to the power supply apparatus.

The microwave plasma generation apparatus 100 can generate the microwave plasma at the atmospheric pressure with a lower power by using the microwave generated by the oscillation amplification unit 200. The microwave plasma generation apparatus 100 can be constructed with a general plasma generation apparatus. As disclosed in Korean Patent Application No. 10-2008-83364 filed by the inventor, the microwave plasma generation apparatus 100 is preferably constructed with a resonator having a coaxial cable, an outer conductor, a connector, and a discharge tip in order to improve a portability thereof.

Figure 4:
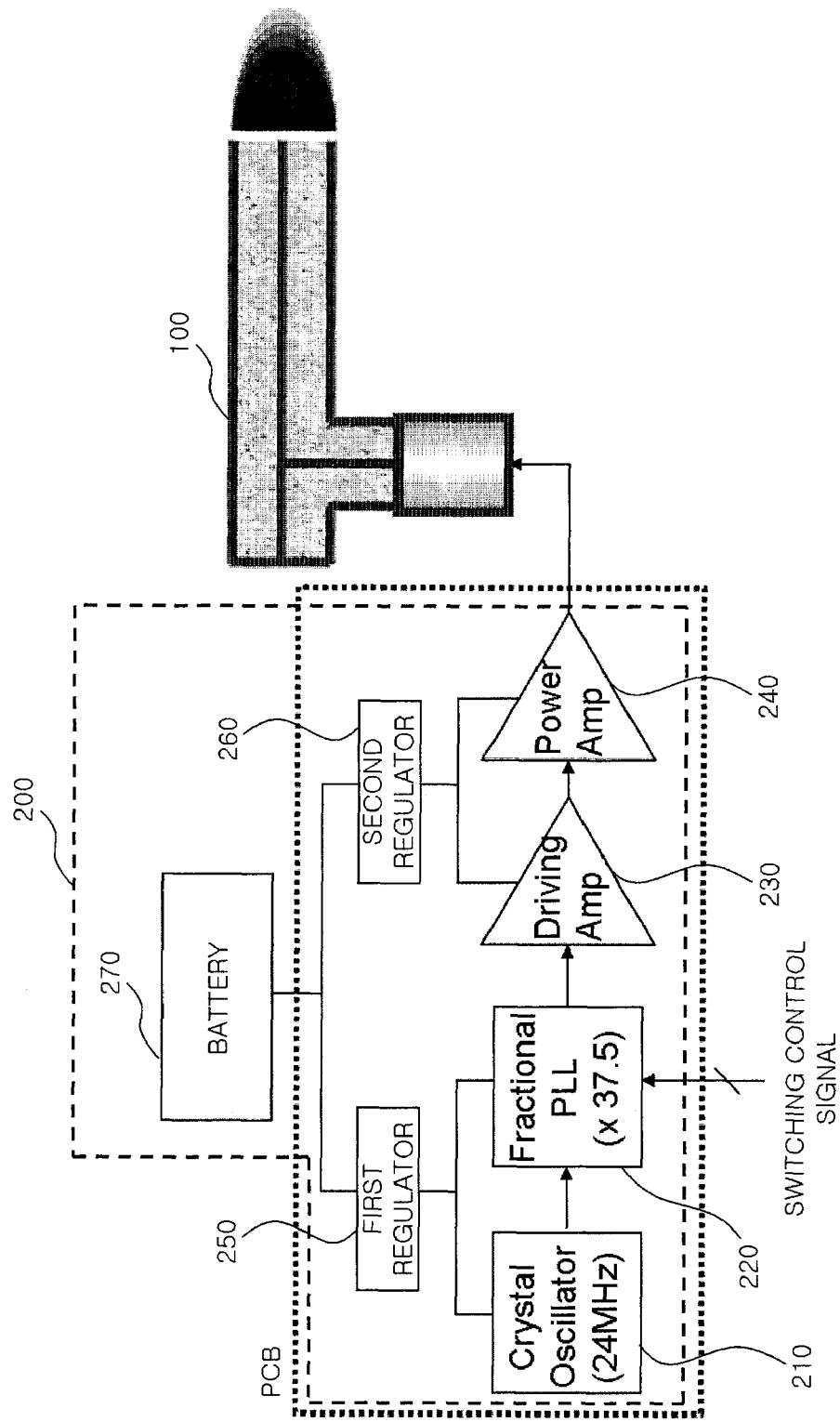
FIG. 4 is a schematic block diagram illustrating a construction of an oscillation amplification unit of the portable power supply apparatus for generating microwave plasma according to the present invention.

FIG. 4 is a schematic block diagram illustrating a construction of an oscillation amplification unit of the portable power supply apparatus for generating microwave plasma according to the present invention.

Referring to FIG. 4, the oscillation amplification unit 200 includes a crystal oscillator 210, a fractional PLL (phase locked loop) 220, a power amplifier 240, a driving amplifier 230, first and second regulators 250 and 260, and a battery 270. The crystal oscillator 210, the fractional PLL 220, the power amplifier 240, and the driving amplifier 230 except for the battery 270 are preferably mounted on a printed circuit board (PCB). Accordingly, a volume of the power supply apparatus can be minimized, so that it is possible to improve the portability thereof.

The crystal oscillator 210 is constructed with an oscillator including an oscillation circuit for generating the microwave which is used as a power source for generating the plasma. The crystal oscillator 210 is designed to oscillate a signal having a frequency of 24 MHz.

The fractional PLL 220 uses a frequency divider to receive a signal having a lower reference frequency and generate a signal having a higher output frequency. The fractional PLL 220 is constructed with a fractional-N PLL which has advantages in terms of in-band noise, lock time, and a spurious effect of a reference frequency in comparison with an integer frequency division scheme. The fractional PLL 220 is connected to an output stage of the crystal oscillator 210 to receive the signal having a frequency of 24 MHz generated by the oscillation circuit. The fractional PLL 220 changes the signal into a signal having a desired frequency of, for example, 900 MHz or 2.45 GHz, of which energy is needed for the microwave plasma generation apparatus 100.

The power amplifier 240 receives the signal having a predetermined frequency, that is, 900 MHz or 2.45 GHz generated by the fractional PLL 220 and amplifies the signal up to about 5 W which is to be supplied to the microwave plasma generation apparatus 100. The microwave plasma generation apparatus 100 generates an atmospheric pressure plasma jet (APPJ) with such a low power as 5 W or less supplied by the power amplifier 240.

Preferably, the driving amplifier 230 for impedance matching is further provided between the output stage of the fractional PLL 220 and the input stage of the power amplifier 240. In addition, preferably, a directional coupler 310 described later is connected to the output stage of the power amplifier 240 so as to detect the reflection power reflected from the microwave plasma generation apparatus 100. Accordingly, the microwave can be preferably supplied to the microwave plasma generation apparatus 100 through the directional coupler 310.

The battery 270 is constructed to have a small volume and to be rechargeable. In addition, preferably, the battery 270 is constructed with a rechargeable battery which can supply a voltage of about 10V or 15V to components mounted on the PCB.

The first regulator Regulator_1 250 adjusts the voltage supplied from the battery 270 to be a stable constant voltage and supplies the constant voltage to the crystal oscillator 210 and the fractional PLL 220. The second regulator Regulator_2 260 adjusts the voltage supplied from the battery 270 to be a stable constant voltage and supplies the constant voltage to the power amplifier 240 and the driving amplifier 230.

Figure 5:
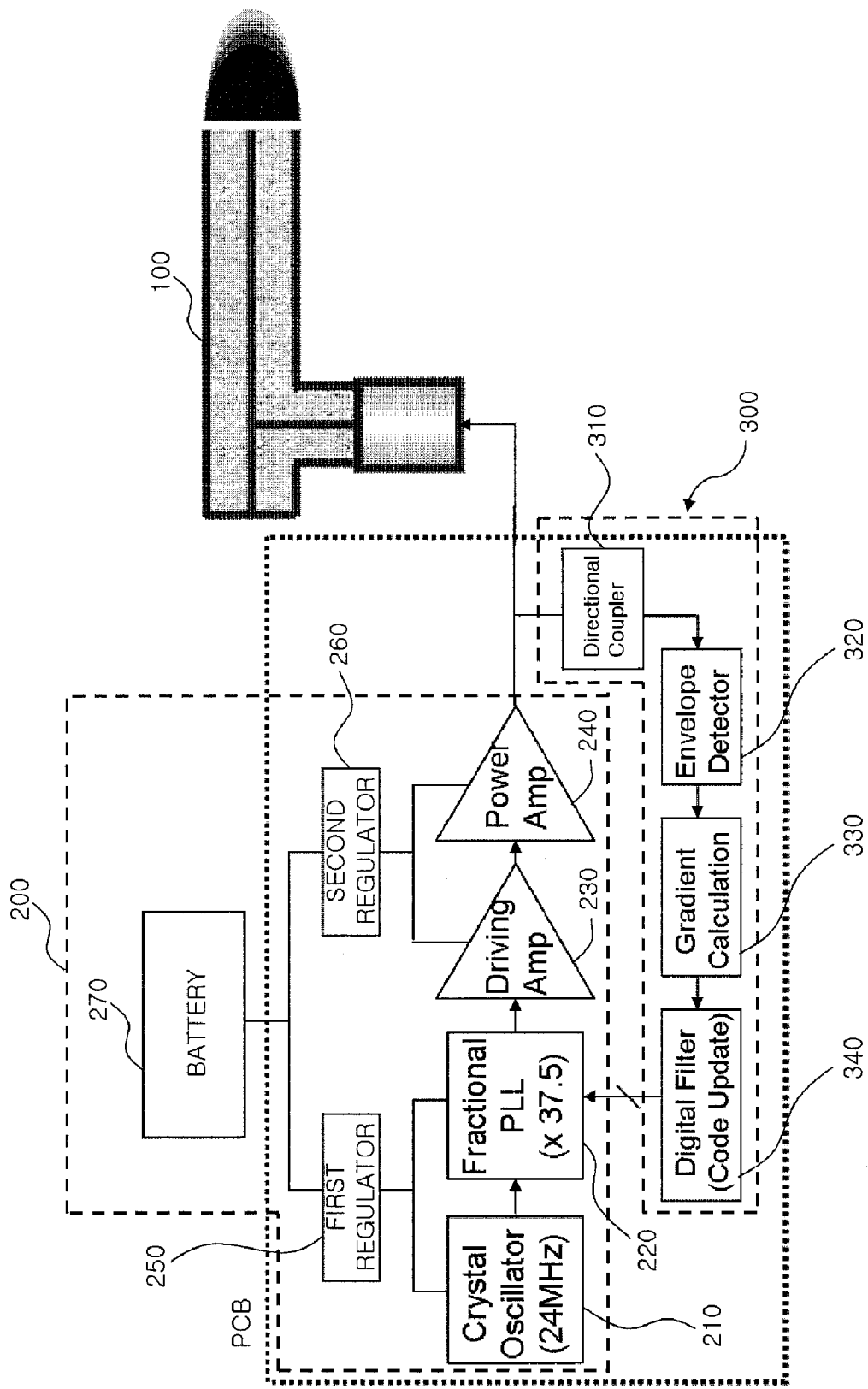
FIG. 5 is a schematic block diagram illustrating a construction of a portable power supply apparatus provided with a reflection power feedback unit according to the present invention.

FIG. 5 is a schematic block diagram illustrating a construction of a portable power supply apparatus provided with a reflection power feedback unit according to the present invention. Since an oscillation amplification unit of the power supply apparatus shown in FIG. 5 is the same as the oscillation amplifier shown in FIG. 4, only the reflection power feedback unit is to be described.

Referring to FIG. 5, the reflection power feedback unit 300 includes a directional coupler 310, an envelope detector 320, a gradient calculator 330, and a digital filter 340. Preferably, the directional coupler 310, the envelope detector 320, the gradient calculator 330, and the digital filter 340 together with the oscillation amplification unit 200 excluding the battery 270 are mounted on a single PCB, so that it is possible to minimize the volume of the power supply apparatus.

In addition, preferably, the fractional PLL 220 and the driving amplifier 230 of the oscillation amplification unit 200 and the envelope detector 320, the gradient calculator 330, and the digital filter 340 of the reflection power feedback unit 300 are constructed in a one chip, so that it is possible to minimize the volume and weight of the power supply apparatus and to improve the portability thereof.

The directional coupler 310 is connected to the one stage of the microwave plasma generation apparatus 100 so as to measure the reflection power reflected from the microwave plasma generation apparatus 100 after the generation of plasma. For this reason, the directional coupler 310 is connected to the output stage of the power amplifier 240 in the oscillation amplification unit 200 which supplies the power to the microwave plasma generation apparatus 100, so that the directional coupler 310 can receive the reflection power as a feedback and monitor a change in the reflection power.

The envelope detector 320 is connected to the directional coupler 310 to compare the reflection power fed back through the directional coupler 310 with a predetermined reference voltage, for example, a previous reflection power, so that the envelope detector 320 can recognize the change in the reflection power.

The gradient calculator 330 is connected to the envelope detector 320 to calculate a gradient of the reflection power reflected from the microwave plasma generation apparatus 100, so that the gradient calculator 330 can calculate a frequency corresponding to a lowest reflection coefficient based on the gradient of the reflection power.

The digital filter 340 has the one stage which is connected to the gradient calculator 330 to receive the calculated frequency. In addition, the digital filter 340 has the other stage which is connected to the fractional PLL 220 in the oscillation amplification unit 200 to supply to the fractional PLL 220 a switching control signal for adjusting a frequency division ratio so as to change the frequency of the microwave supplied to the microwave plasma generation apparatus 100 into a frequency corresponding to the lowest reflection coefficient which is calculated based on the gradient of the reflection power by the gradient calculator 330.

In this manner, in the reflection power feedback unit, the reflection power according to the frequency of the microwave generated by the oscillation amplification unit and supplied to the microwave plasma generation apparatus can be monitored, and the change in the reflection power detected based on the result of the monitoring can be directly used to generate the frequency of the oscillation frequency and to perform accurate frequency correction. Accordingly, it is possible to implement a portable power supply apparatus capable of being operable at the atmospheric pressure and greatly improving efficiency of power consumption of a microwave plasma generation apparatus.

Figure 6:
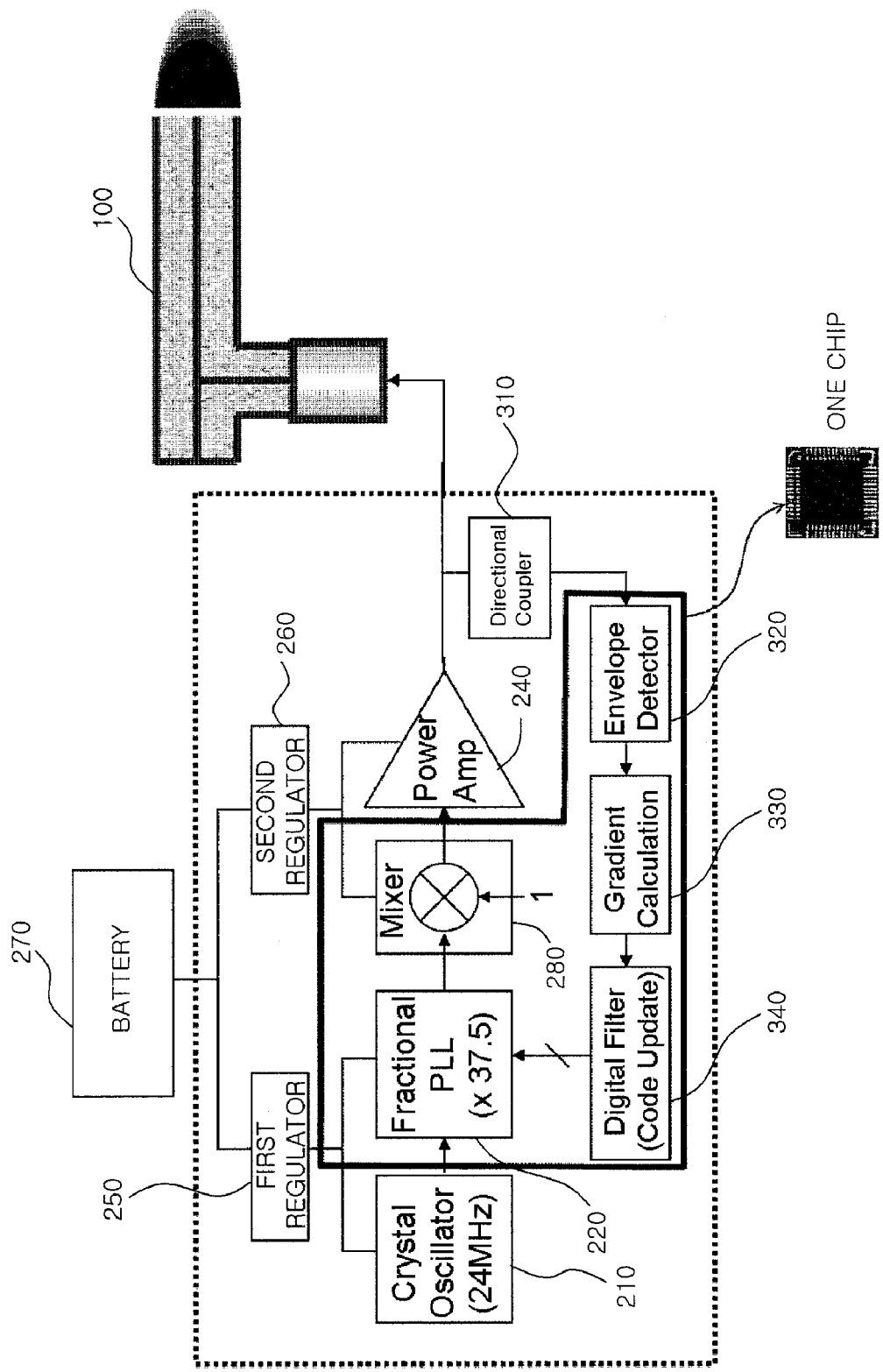
FIG. 6 is a schematic block diagram illustrating a construction of a portable power supply apparatus where components of a reflection power feedback unit are constructed in a one chip, according to the present invention.

FIG. 6 is a schematic block diagram illustrating a construction of a portable power supply apparatus where components thereof are constructed in a one chip, according to the present invention.

Referring to FIG. 6, the portable power supply apparatus for generating microwave plasma includes: an oscillation amplifier which supplies a microwave to a microwave plasma generation apparatus 100; and a reflection power feedback unit 300 which is connected to an output stage of the oscillation amplification unit to measure a change in a reflection power after generation of plasma, generate a switching control signal for adjusting a frequency of the oscillation amplification unit to a value corresponding to the lowest reflection coefficient, and feed back the switching control signal as an oscillation frequency so as to correct the frequency of the microwave.

The oscillation amplification unit includes a crystal oscillator 210, a fractional PLL 220, a power amplifier 240, a mixer 280, first and second regulators 250 and 260, and a battery 270. The crystal oscillator, the fractional PLL, the power amplifier, the first and second regulators, and the battery are the same as those described with reference to FIGS. 4 and 5. The mixer 280 is disposed between the output stage of the fractional PLL 220 and the input stage of the power amplifier 240, so that operations of the mixer 280 are controlled based on logic states of control signals which are externally input.

The fractional PLL 220 and the mixer 280 of the oscillation amplification unit and the envelope detector 320, the gradient calculator 330, and the digital filter 340 of the reflection power feedback unit 300 are constructed in a one chip, so that it is possible to minimize the volume and weight of the power supply apparatus and to improve the portability thereof.

In addition, a micro-controller and a micro-thermometer may further included in the microwave plasma generation apparatus 100 so as to control a gas flow rate as well as to adjust the frequency of the microwave based on the change in the reflection power.

In this case, the micro-thermometer measures a real-time temperature of the plasma generated by the microwave plasma generation apparatus 100 and transmits the measured value to the micro-controller. The micro-controller compares the temperature of the plasma transmitted from the micro-thermometer with a predetermined temperature and automatically regulates the power supply and the gas flow rate so as for a constant temperature value to be maintained.

More specifically, if the measured temperature of the micro-thermometer is higher than the predetermined temperature value, the micro-controller reduces or temporarily blocks the power supplied from the oscillation amplification unit to the microwave plasma generation apparatus and automatically regulates the gas flow rate, so that the temperature of the plasma can be maintained in a constant value. On the contrary, if the measured temperature of the micro-thermometer is lower than the predetermined temperature, the micro-controller increases the power supplied from the oscillation amplification unit to the microwave plasma generation apparatus and automatically regulates the gas flow rate, so that the temperature of the plasma can be maintained in a constant value.

Since a microwave plasma generation apparatus can be supplied with power by a power supply apparatus capable of maximizing an power efficiency, minimizing a volume and weight thereof for improving a portability thereof, and being operable at the atmospheric pressure, it is possible to use the microwave plasma generation apparatus as a portable coagulation apparatus in a battle field as well as a fixed apparatus in a fixed site such as hospitals. In addition, it is possible to improve a usability as a home medical product.

Accordingly, the change in the impedance matching condition is automatically monitored and the frequency of the microwave is adjusted after generation of the plasma as well as at the initial time of generation of plasma, so that it is possible to continuously supply the maximum power to the microwave plasma generation apparatus.

Accordingly, it is possible to reduce the power reflected from the microwave plasma generation apparatus by 10% or more in comparison with a conventional power supply apparatus. In addition, since the power consumption can be minimized, so that it is possible to greatly improve a portability of the power supply apparatus by using a battery.

While the present invention has been shown and described in connection with the exemplary embodiments, it will be apparent to those skilled in the art that modifications and variations can be made without departing from the spirit and scope of the invention as defined by the appended claims.

What is claimed is:

1. A portable power supply apparatus for supplying a power to a microwave plasma generation apparatus for generating microwave plasma, comprising:
   an oscillation amplification unit which has an output stage connected to microwave plasma generation apparatus and which has an oscillator for supplying an amplified microwave; and
   a reflection power feedback unit which has an one stage connected to the microwave plasma generation apparatus to receive as a feedback a reflection power reflected from the microwave plasma generation apparatus at the time of generation of the plasma and measure a gradient of the reflection power and which has an other stage connected to the oscillation amplification unit to generate a switching control signal for adjusting the frequency of the microwave as a frequency suitable for the changed reflection power and supply the switching control signal,
   wherein the oscillation amplification unit comprises:
   a crystal oscillator which has an oscillator including an oscillation circuit for generating the microwave;
   a fractional PLL (Phase Locked Loop) which receives a signal oscillated by the crystal oscillator and generate a signal having a high frequency in a fractional division scheme;
   a power amplifier which amplifies the high-frequency signal generated by the fractional PLL up to 5 W and supplies the amplified signal to the microwave plasma generation apparatus;
   a driving amplifier which is disposed between an output stage of the fractional PLL and an input stage of the power amplifier to match impedance;
   a battery which supplies a power for generating the microwave and operating the power supply apparatus;
   a first regulator which adjusts the voltage supplied from the battery to be a stable constant voltage and supplies the constant voltage to the crystal oscillator and the fractional PLL; and
   a second regulator which adjusts the voltage supplied from the battery to be a stable constant voltage and supplies the constant voltage to the power amplifier and the driving amplifier.

2. The portable power supply apparatus according to claim 1,
   wherein the crystal oscillator oscillates a signal having a frequency of 24 MHz, and
   wherein the fractional PLL receives the signal and changes the signal into a signal having a frequency of 900 MHz or 2.45 GHz, of which energy is needed for the microwave plasma generation apparatus.

3. The portable power supply apparatus according to claim 2, wherein the power amplifier is constructed to amplify the signal output from the fractional PLL up to 5 W.

4. The portable power supply apparatus according to claim 1, wherein the crystal oscillator, the fractional PLL, the power amplifier, and the driving amplifier are mounted on a printed circuit board.

5. The portable power supply apparatus according to claim 1, wherein the reflection power feedback unit comprises:
   a directional coupler which connected to a stage of the microwave plasma generation apparatus to measure and monitor a reflection power reflected from the microwave plasma generation apparatus 100 after the generation of the plasma;
   an envelope detector which has a stage connected to the directional coupler to compare the reflection power measured by the directional coupler with a reference voltage so as to recognize a change in the reflection power;
   a gradient calculator which has a stage connected to the envelope detector to calculate a gradient of the reflection power and calculate a frequency corresponding to the lowest reflection coefficient based on the gradient; and
   a digital filter which has the one stage connected to the gradient calculator to receive the calculated frequency value and the other stage connected to the fractional PLL in the oscillation amplification unit to supply to the fractional PLL a switching control signal for adjusting a frequency division ratio so as to change the frequency of the microwave supplied to the microwave plasma generation apparatus into a frequency corresponding to the lowest reflection coefficient which is calculated based on the gradient of the reflection power by the gradient calculator.

6. The portable power supply apparatus according to claim 5, wherein the directional coupler, the envelope detector, the gradient calculator, and the digital filter together with the oscillation amplification unit are mounted on a single PCB.

7. The portable power supply apparatus according to claim 6, wherein the fractional PLL, the driving amplifier, the envelope detector, the gradient calculator, and the digital filter are constructed in an one chip.

8. A portable power supply apparatus for supplying a power to a microwave plasma generation apparatus for generating microwave plasma, comprising:
   an oscillation amplification unit which has an output stage connected to microwave plasma generation apparatus and which has an oscillator for supplying an amplified microwave; and
   a reflection power feedback unit which has an one stage connected to the microwave plasma generation apparatus to receive as a feedback a reflection power reflected from the microwave plasma generation apparatus at the time of generation of the plasma and measure a gradient of the reflection power and which has an other stage connected to the oscillation amplification unit to generate a switching control signal for adjusting the frequency of the microwave as a frequency suitable for the changed reflection power and supply the switching control signal,
   wherein the oscillation amplification unit comprises:
   a crystal oscillator which has an oscillator including an oscillation circuit for generating the microwave;
   a fractional PLL (Phase Locked Loop) which receives a signal oscillated by the crystal oscillator and generate a signal having a high frequency in a fractional division scheme;
   a power amplifier which amplifies the high-frequency signal generated by the fractional PLL up to 5 W and supplies the amplified signal to the microwave plasma generation apparatus;
   a mixer which is disposed between an output stage of the fractional PLL and an input stage of the power amplifier and of which operations are controlled based on logic states of control signals which are externally input;
   a battery which supplies a power for generating the microwave and operating the power supply apparatus;

a first regulator which adjusts the voltage supplied from the battery to be a stable constant voltage and supplies the constant voltage to the crystal oscillator and the fractional PLL; and a second regulator which adjusts the voltage supplied from the battery to be a stable constant voltage and supplies the constant voltage to the power amplifier and the driving amplifier, and wherein the reflection power feedback unit comprises:

a directional coupler which connected to a stage of the microwave plasma generation apparatus to measure and monitor a reflection power reflected from the microwave plasma generation apparatus 100 after the generation of the plasma;

an envelope detector which has a stage connected to the directional coupler to compare the reflection power measured by the directional coupler with a reference voltage so as to recognize a change in the reflection power;

a gradient calculator which has a stage connected to the envelope detector to calculate a gradient of the reflection power and calculate a frequency corresponding to the lowest reflection coefficient based on the gradient; and a digital filter which has the one stage connected to the gradient calculator to receive the calculated frequency value and the other stage connected to the fractional PLL in the oscillation amplification unit to supply to the fractional PLL a switching control signal for adjusting a frequency division ratio so as to change the frequency of the microwave supplied to the microwave plasma generation apparatus into a frequency corresponding to the lowest reflection coefficient which is calculated based on the gradient of the reflection power by the gradient calculator.

9. The portable power supply apparatus according to claim 8, wherein the fractional PLL, the mixer, the envelope detector, the gradient calculator, and the digital filter are constructed in an one chip.

10. The portable power supply apparatus according to claim 9, further comprising:

a micro-thermometer which measures a temperature of the plasma generated by the microwave plasma generation apparatus and transmits the temperature to the micro-controller, wherein the micro-controller compares the temperature of the plasma transmitted from the micro-thermometer with a predetermined temperature value and automatically regulates the power supply and the gas flow rate so as for a constant temperature value to be maintained.

* * * * *